(12) United States Patent
Sucher et al.

(10) Patent No.: US 10,438,837 B2
(45) Date of Patent: Oct. 8, 2019

(54) ANNEAL AFTER TRENCH SIDEWALL IMPLANT TO REDUCE DEFECTS

(71) Applicant: TEXAS INSTRUMENTS INCORPORATED, Dallas, TX (US)

(72) Inventors: Bradley David Sucher, Murphy, TX (US); Bernard John Fischer, Richardson, TX (US); Abbas Ali, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/991,938

(22) Filed: May 29, 2018

(65) Prior Publication Data

US 2018/0342416 A1 Nov. 29, 2018

Related U.S. Application Data

(62) Division of application No. 15/603,856, filed on May 24, 2017, now Pat. No. 10,032,663.

(51) Int. Cl.
| | |
|---|---|
| *H01L 21/00* | (2006.01) |
| *H01L 21/762* | (2006.01) |
| *H01L 29/06* | (2006.01) |
| *H01L 27/088* | (2006.01) |
| *H01L 21/8234* | (2006.01) |

(52) U.S. Cl.
CPC .... *H01L 21/76237* (2013.01); *H01L 29/0649* (2013.01); *H01L 21/823481* (2013.01); *H01L 27/088* (2013.01)

(58) Field of Classification Search
CPC combination set(s) only.
See application file for complete search history.

(56) References Cited

U.S. PATENT DOCUMENTS

| | | | |
|---|---|---|---|
| 8,173,551 B2 * | 5/2012 | Bai | C30B 25/183 438/758 |
| 8,382,894 B2 * | 2/2013 | Nakai | C30B 29/06 117/106 |
| 2005/0054124 A1 * | 3/2005 | Mun | H01L 21/3225 438/12 |
| 2012/0001301 A1 * | 1/2012 | Ebara | C30B 29/06 257/617 |
| 2014/0045321 A1 | 2/2014 | Sucher et al. | |
| 2015/0130016 A1 | 5/2015 | Kao | |
| 2015/0187597 A1 | 7/2015 | Sucher et al. | |

* cited by examiner

*Primary Examiner* — Fernando L Toledo
*Assistant Examiner* — Valerie N Newton
(74) *Attorney, Agent, or Firm* — Andrew R. Ralston; Charles A. Brill; Frank D. Cimino (57) ABSTRACT

An electronic device includes a semiconductor substrate having a plurality of trenches formed therein. Each trench includes a sidewall having a doped region, a sidewall liner, and a filler material. The substrate has a slip density of less than 5 $cm^{-2}$. The low slip density is achieved by a novel annealing protocol performed after implanting the dopant in the sidewall to repair damage and/or stress caused by the implant process.

18 Claims, 9 Drawing Sheets

ANNEAL AFTER TRENCH SIDEWALL IMPLANT TO REDUCE DEFECTS

CROSS REFERENCE TO RELATED APPLICATIONS

Under 35 U.S.C. § 120, this divisional application claims the benefit of and priority to U.S. patent application Ser. No. 15/603,856, filed on May 24, 2017, the entirety of which is hereby incorporated herein by reference.

FIELD

Disclosed embodiments relate to integrated circuit (IC) manufacturing, more particularly to trench isolation processing during IC manufacturing.

BACKGROUND

Shallow trench isolation (STI) and deep trench isolation (DTI) are known for electrically isolating neighboring devices such transistors from one another. STI is generally 0.2 µm to 2 µm deep, while DTI is generally from 2 µm to 40 µm deep. The typical STI or DTI formation process includes growing a blanket pad oxide layer, depositing a blanket silicon nitride layer (with an optional top deposited silicon oxide layer) followed by a trench mask, then a reactive ion etch (RIE) through the silicon nitride and pad oxide and into the typical crystalline silicon substrate surface underneath to form trenches. Some trench processes then add an angled implant into the silicon at the trench sidewalls for increasing the oxidation rate or for an isolation enhancement (e.g., providing a low resistance connection to a same doped type buried layer to form an isolation tank). The trench implant is usually a high dose ion implant, typically using an implant dose of at least about $1 \times 10^{15}$ $cm^{-2}$.

Suitable trench sidewall implant species include argon or other inert elements, oxygen, and active silicon dopant elements such as phosphorous and arsenic for an isolation enhancement. There can be some oxidation performed before this sidewall trench implant, such as a growing a silicon oxide layer for example. Following the angled trench implant a rapid thermal processing (RTP) or a furnace anneal may be used to anneal out some of the implant-induced crystal damage from the trench implant.

The trench mask is then stripped and a thermal liner oxide layer is grown (e.g., such as 1050° C.) to form an oxide lined trench which can also provide some annealing if it is a significant thermal cycle performed prior to any significant oxidation taking place. Next, a deposited oxide layer such as a high density plasma (HDP) oxide layer or a polysilicon layer is deposited to fill the oxide lined trench and the substrate is again heated in the case of a deposited oxide to densify the deposited oxide. In the case of polysilicon fill, the polysilicon may be doped, typically in-situ doped. Finally, the silicon oxide or polysilicon overburden is polished back to the buried silicon nitride surface generally using Chemical Mechanical Polishing (CMP), and then the silicon nitride/pad oxide is then stripped off.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize STI or DTI formation processes that include a trench sidewall implant can result in slip dislocations originating primarily from the edge of the trench, typically from a trench corner, and other crystal defects. Defects being at the edges of the active area can cause junction leakage which may degrade the IC yield. Slip dislocations may be termed edge dislocations when the origin of the slip is the edge of wafer or an edge of a device feature. Slip dislocations are generally a primary component of crystalline defect density.

Slip formation is generally exacerbated when large diameter wafers (e.g., ≥200 mm, such as 300 mm) are involved. Slip reduction at substrate edges of the trench generally involves modifying the thermal liner oxidation step to use a relatively slow temperature ramp-up rate, or by using a silicon long finger wafer boat. However, although these known slip reduction methods are generally effective for reducing slip density, they have been found to be ineffective in reducing slip density in the substrate sidewall of trenches when the slip is induced by the conventional high dose ion implantation into the trench sidewall.

It has also been found that Rapid Thermal Processing (RTP) after trench sidewall implant before the thermal liner oxide step results in a significant increase in slip density. Moreover, it has been discovered that a furnace trench anneal after sidewall implant before the thermal liner step in a non-oxidizing ambient during at least a portion of the ramp-up of the anneal significantly reduces defect density including slip density by annealing out the substrate crystal damage before oxidation takes place. A non-oxidizing ambient for a disclosed furnace trench anneal after sidewall implant is defined herein to be an $O_2$ flow into the furnace of less than 0.1 standard liter per minute (SLM). Disclosed furnace trench annealing can comprise a separate furnace anneal process, or can be combined with thermal liner oxide by annealing out the implant damage in non-oxidizing ambient during the ramp-up to the thermal oxidation temperature.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIGS. 1A-1F are cross-sectional diagrams showing processing progression for an example method of forming an IC having trench isolated MOS transistors including forming isolation trenches comprising a non-oxidizing trench anneal after sidewall implant prior to oxidation to reduce slip density, according to an example embodiment. Using disclosed methods, slip dislocations that result in leakage failures in ICs having trench isolation technology caused by trench sidewall implant damage/stress are essentially eliminated.

Figure 1A:
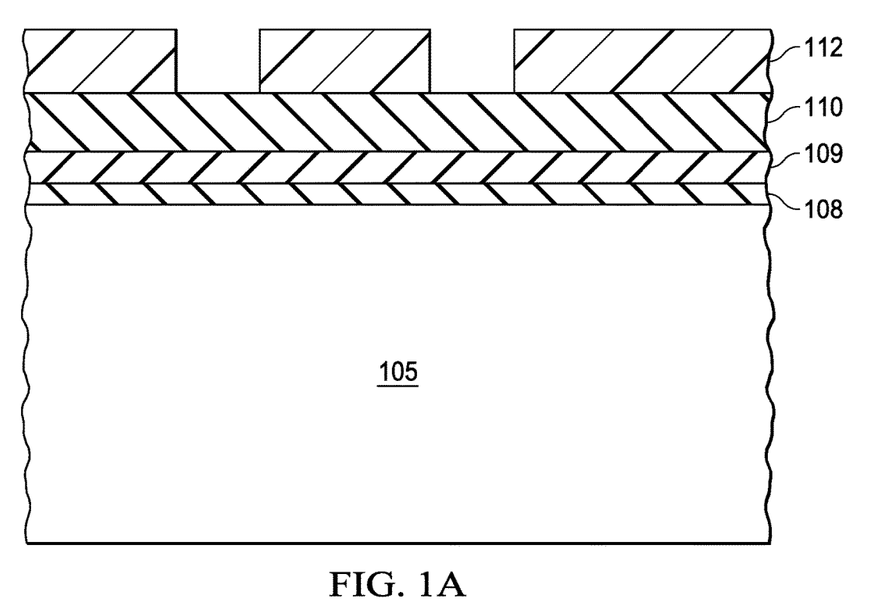
FIGS. 1A-1F are cross-sectional diagrams showing processing progression for an example method of forming an IC having trench isolated metal-oxide-semiconductor (MOS) transistors including forming isolation trenches comprising a non-oxidizing trench anneal after sidewall implant prior to oxidation to reduce slip density, according to an example embodiment.

FIG. 1A shows a portion of the in-process IC having a patterned masking layer 112 such as a photoresist pattern on a hard mask stack of the substrate 105. The forming the pattern can comprise photoresist coating, patterning and developing to provide the patterned masking layer 112 shown. A hard mask layer is shown by example as a three-layer hard mask stack including layers 110, 109 and 108, such as a top deposited silicon oxide layer for layer 110, a deposited silicon nitride layer for layer 109, and a thermal silicon 'pad' oxide layer for layer 108.

In various embodiments, the substrate 105 can comprise bulk silicon, epitaxial silicon on bulk silicon, silicon-germanium, or other substrate materials that provide a semiconductor surface. The substrate 105 can have a diameter of at least (≥) 200 mm, such as 300 mm. In one embodiment the substrate 105 comprises a p− substrate having a boron doping concentration between $1\times10^{14}$ cm$^{-3}$ to $1\times10^{16}$ cm$^{-3}$, or a p+ substrate having a boron doping concentration between $1\times10^{17}$ cm$^{-3}$ to $1\times10^{19}$ cm$^{-3}$. A buried layer (BL) may be embedded in the substrate 105 (see BL 119 in FIGS. 2A-2D described below).

Figure 1B:
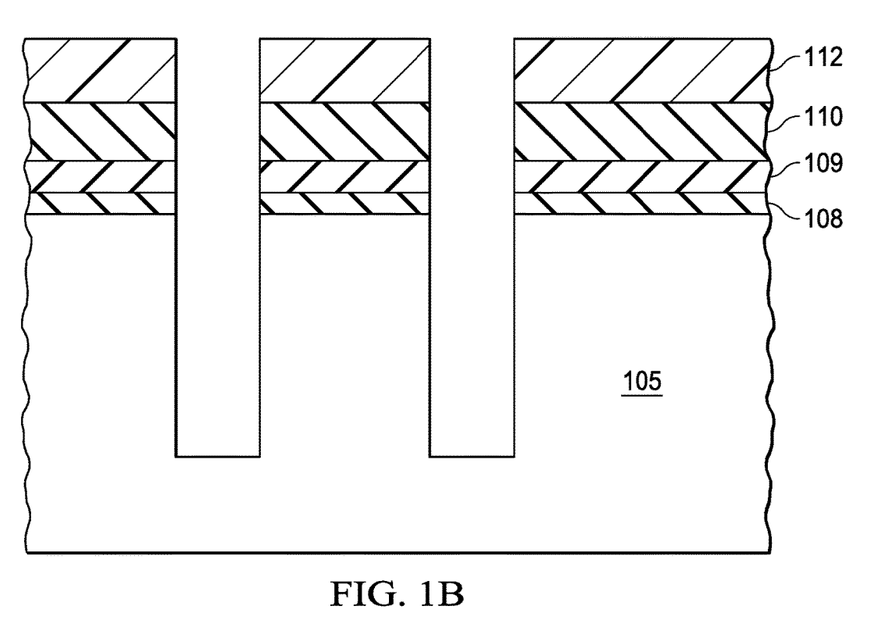
Figure 1C:
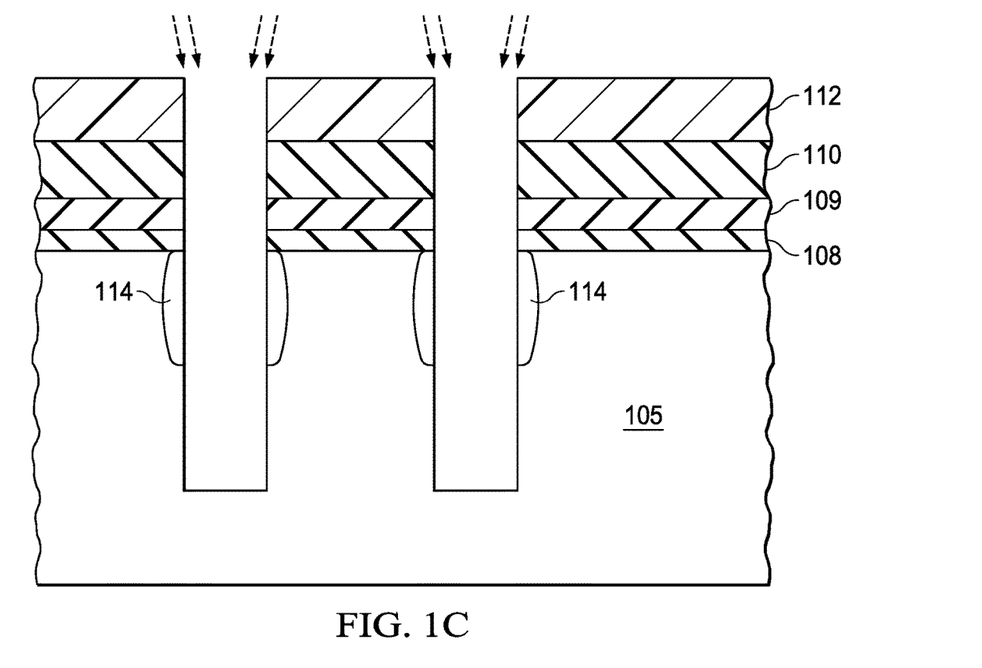

FIG. 1B shows a portion of the in-process IC showing trenches formed after trench etching. The trench etching can comprise deep reactive ion etching (DRIE) which anisotropically etches through the hard mask layers 110, 109, 108. The trench depth can be 0.2 m to 40 μm to upon filling provide filled trenches that same depth. In some embodiment the trench depth is from 5 μm to 35 μm to provide 5 μm to 35 μm deep filled trenches. FIG. 1C shows a portion of the in-process IC showing trenches being doped using an angled sidewall implant for doping the semiconductor sidewalls of the trenches to form doped sidewalls 114. This implant is generally with the patterned masking layer 112 as shown thereon to protect the active areas of the IC. The selected implant angle value for the sidewall implant depends on the depth and width of the trench, such as 10 to 20 degrees for a trench depth of 1 μm to 15 μm. The arrows shown in FIG. 1C represent the angled ion beam. By further rotating the implant sample wafers, either intermittently or continuously, the trench sidewalls become more uniformly doped along their full length which is possible, but not required. The masking layer 112 is then removed. For example, the removal can comprise ashing and then cleaning in the case the masking layer 112 comprises photoresist.

A post-trench furnace anneal is performed after the trench implanting. As used herein, a "furnace" used for disclosed "furnace processing steps" is defined to have its conventional meaning, that being a long tube heated over a large process zone (>0.5 m) that accommodates multiple semiconductor wafers (one or more lots) at a time, where the total process time from loading to unloading is generally at least 0.5 hrs, and that attainable temperature ramp rate is generally <20° C./min (although some fast ramp furnaces can achieve significantly faster ramp rates). Furnace processing may be distinguished from RTP which refers to a semiconductor manufacturing process that heats single wafers to high temperatures (up to 1050° C. or greater) on a timescale of several minutes or less, where the rapid heating rates are often attained by high intensity lamps or lasers.

The post-trench furnace anneal includes a ramp-up portion with a ramp-up rate range of 2° C./min to 10° C./min, to a maximum peak temperature range of at least 975° C. that is generally 1000° C. to 1100° C., with a typical time at the high temperature of 60 min to 90 min, but can be shorter or longer than this time range. At least a portion of the ramp-up is performed in a non-oxidizing ambient (non-oxidizing ramp-up portion) with the $O_2$ flow shut off and thus no measurable $O_2$ flow so that the $O_2$ flow is 0.1 SLM. For example, $N_2$, Ar, He, Ne, or combinations of these may be used for the furnace ambient. SLM or SLPM is a unit of volumetric flow rate of a gas corrected to "standardized" conditions of temperature and pressure, defining essentially no $O_2$ flow. One specific ramp-up is from 700° C. to 1050° C. at a ramp of 6° C./min with the non-oxidizing ramp-up portion being in a $N_2$ ambient due to flowing only $N_2$.

Figure 1D:
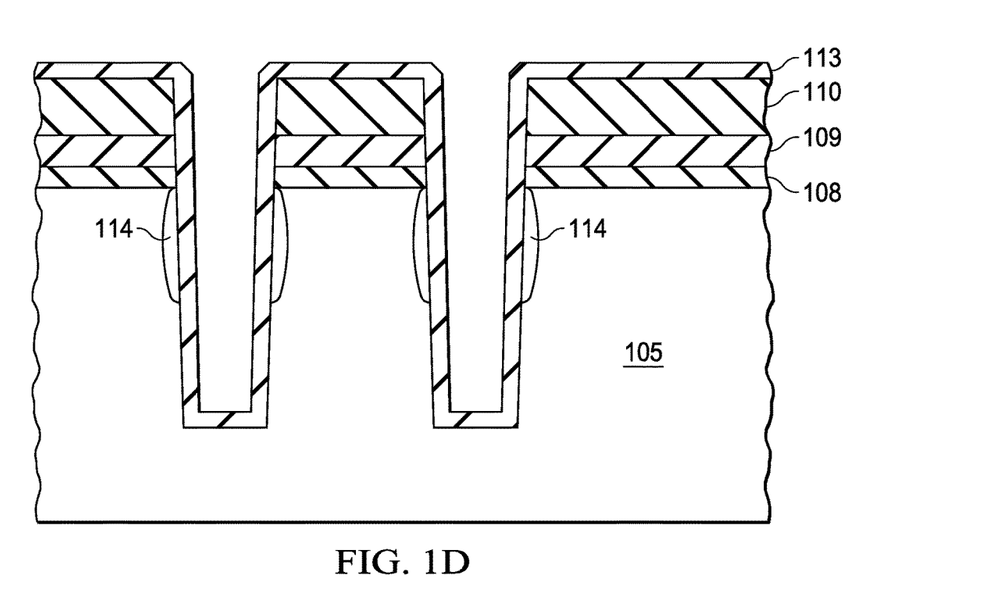

The ramp-down portion is generally performed with a ramp-down rate that is typically 1° C./min to 3° C./min. However, specially configured furnaces ramp down faster, up to about a 30° C./min ramp-down rate. The ambient during ramp-down can be a non-oxidizing ambient with no measurable $O_2$ flow, but $O_2$ flow can be generally used during the ramp-down without any deleterious effects FIG. 1D shows a portion of the in-process IC showing the trenches with doped sidewalls 114 after forming a dielectric liner 113 on the trench sidewalls which follows disclosed furnace annealing. The dielectric liner 113 can comprise a thermally grown oxide. The dielectric liner 113 can also comprise a deposited High Temperature Oxide (HTO) liner using a low pressure chemical vapor deposition (LPCVD) process at temperature of 500° C. or higher. The dielectric liner 113 is generally 10 nm to 30 nm thick.

Figure 1E:
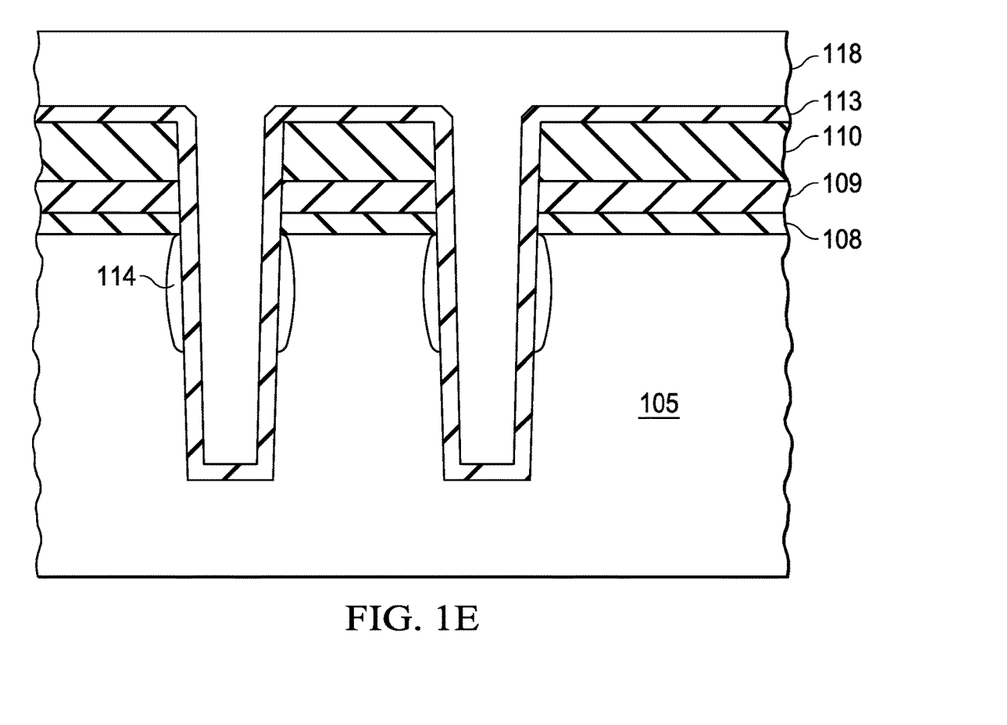
Figure 1F:
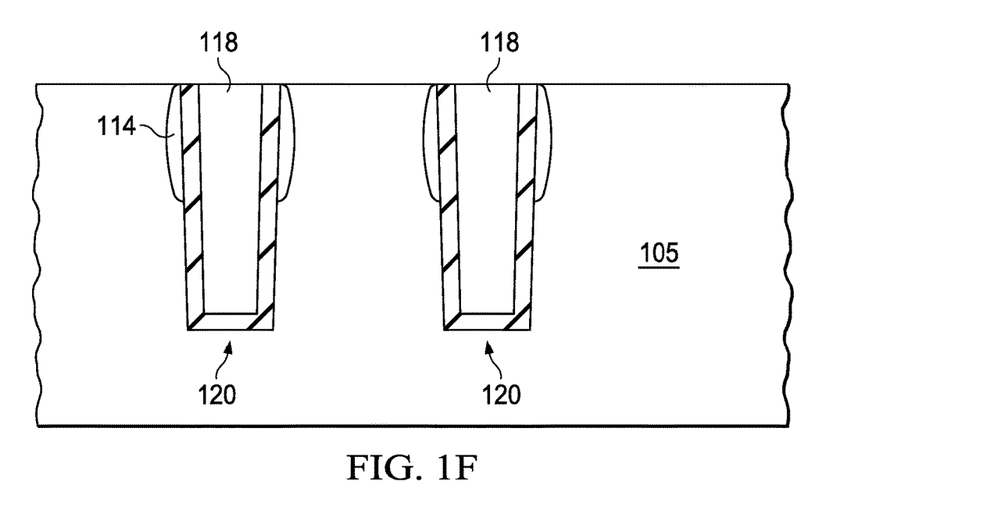

FIG. 1E shows a portion of the in-process IC showing the trenches after trench filling. In this embodiment the trench can be filled with a deposited material 118, such as a dielectric material, or another material such as polysilicon. FIG. 1F shows a portion of the in-process IC showing the filled trenches 120 after removing overburden portions of deposited material 118 (e.g., using CMP) and removal of the trench hard mask stack comprising layers 110, 109 and 108.

Although not shown, as well known in the art subsequent IC processing includes lithography, etching, thin film depositions and growth, diffusion, and ion implants for forming a desired pattern of transistors, resistors and capacitors, and then metallization generally comprising a multi-level metallization stack, followed by a patterned passivation layer. In the final IC the locally doped substrate edges of the trenches 120 have a dopant concentration from $1 \times 10^{16}$ cm$^{-3}$ to $1 \times 10^{21}$ cm$^{-3}$, thus the doped substrate edges of the trenches being doped above the background doping level due to the trench implanting, with their minimum doping concentration value of $5 \times 10^{17}$ cm$^{-3}$ in a typical embodiment.

Figure 2A:
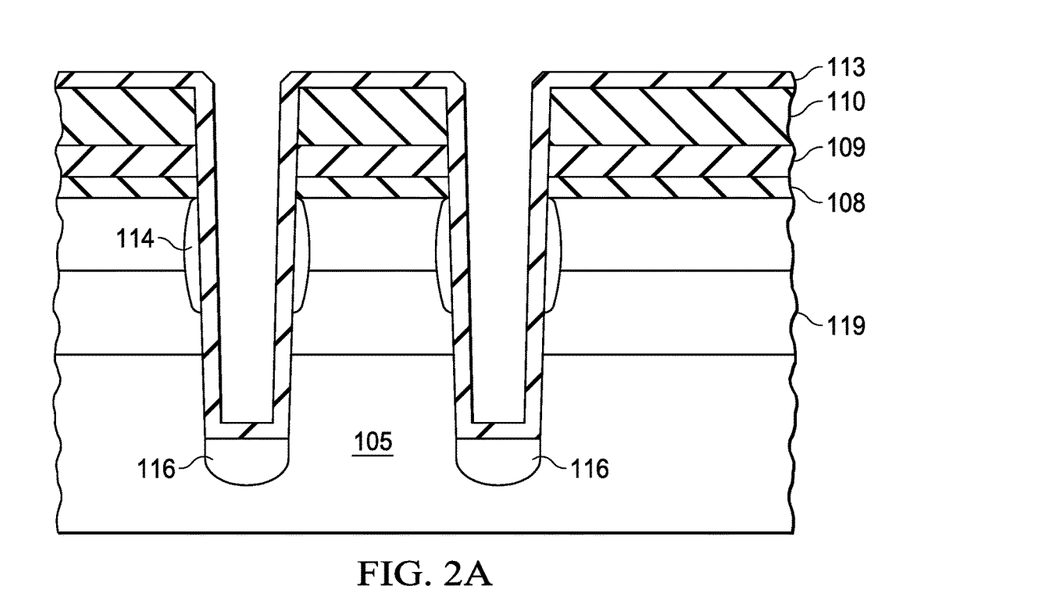
FIGS. 2A-2D are cross-sectional diagrams showing processing progression for an example method of forming an IC having top side contact (TSC) trenches comprising a non-oxidizing trench anneal after sidewall implant prior to oxidation to reduce slip density, according to an example embodiment.

As noted above, disclosed trenches for isolation can be TSC trenches as opposed to being conventional isolation trenches. TSC trenches can provide improved isolation and higher trench-to-trench breakdown voltage values as compared to conventional isolation trench structures. FIGS. 2A-2D are cross-sectional diagrams showing processing progression for an example method of forming an IC having TSC trenches. FIG. 2A shows results after TSC bottom implant that forms a bottom doped region 116 by implanting the in-process IC shown in FIG. 1D with the dielectric liner 113 on the trench sidewalls and with doped sidewalls 114. The TSC bottom implant can be a blanket implant or a patterned implant. For example, for contact to a p-substrate, boron may be used as the bottom implant with a dose from $1 \times 10^{14}$ to $9 \times 10^{15}$ cm$^{-2}$, an energy from 20 keV to 40 keV, a 0 degree tilt, and with a 45 degree twist angle. There is generally a buried layer within the substrate 105, shown as BL 119, where the doped sidewalls 114 are deep enough as shown to reach the top of the BL 119.

Figure 2B:
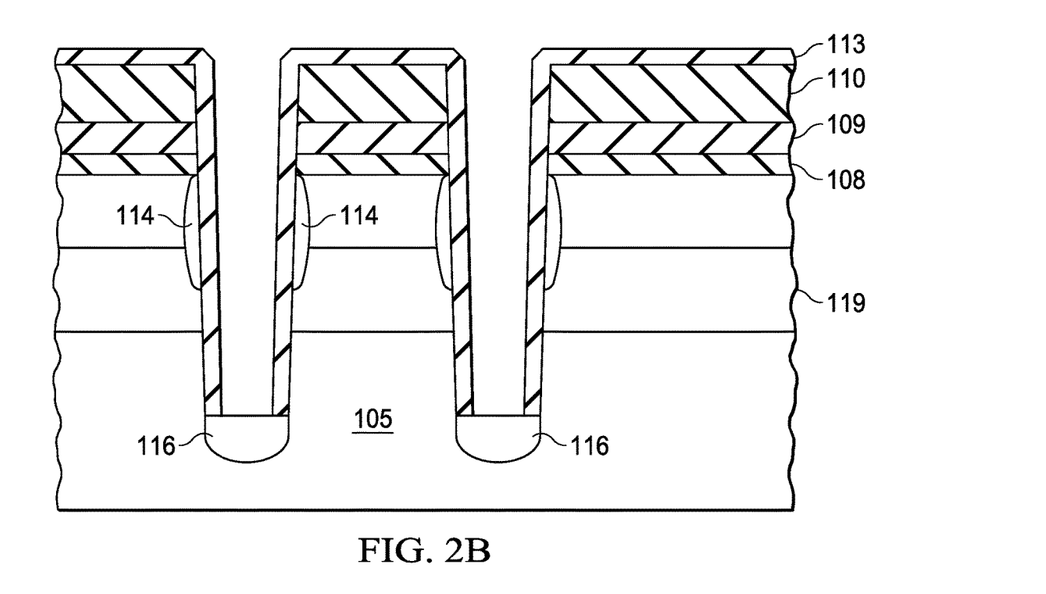

A TSC bottom etch follows the TSC bottom implant with the results shown in FIG. 2B. There is generally no masking layer used for this bottom etching so that the dielectric liner 113 is blanket etched resulting in the field regions of the dielectric liner 113 being thinned too. The blanket etch process in one particular example can comprise a plasma etch process using $C_4F_8$/Ar/$O_2$ chemistry at about 40 m Torr and 1700 W of radio frequency (RF) power.

Figure 2C:
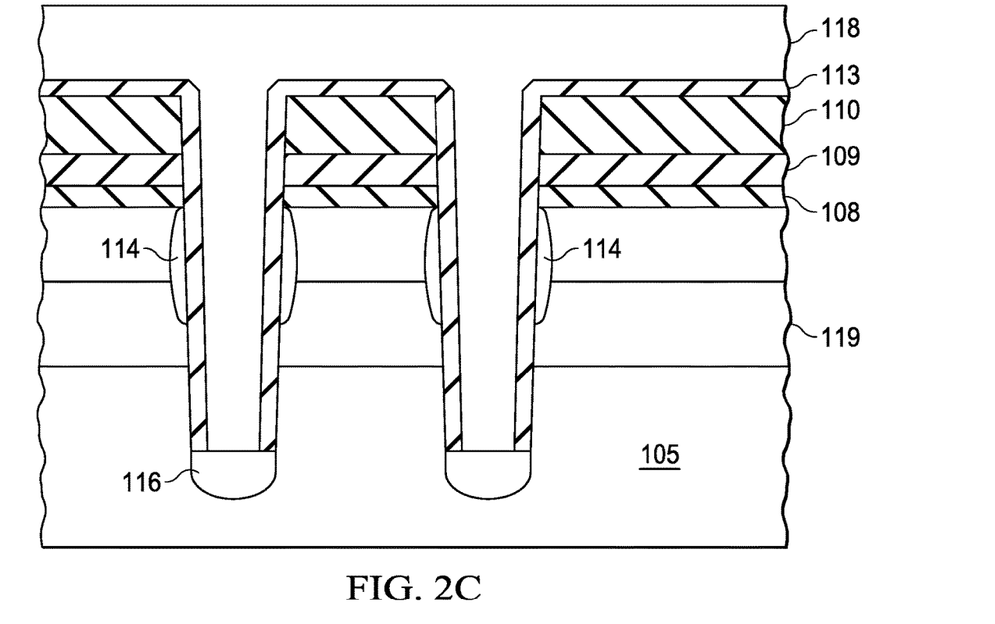

FIG. 2C shows a portion of the in-process IC showing the TSC trenches after trench filling. In this embodiment the trench is generally filed with a deposited material 118 comprising polysilicon. The polysilicon depositing can comprise LPCVD utilizing silane ($SiH_4$) gas at a deposition temperature range of 550° C. to 650° C. and a pressure range from 100 mTorr to 400 mTorr. The doped polysilicon thickness may be about 1.6 µm to 2.2 µm. In-situ doped polysilicon may also be used, or the polysilicon can be deposited undoped then ion implanted to dope it. When the deposited material 118 comprises polysilicon, after completion of fabricating the IC, the polysilicon filled TSC generally has a 25° C. sheet resistance less than or equal ($\le$) 70 ohms/sq.

Figure 2D:
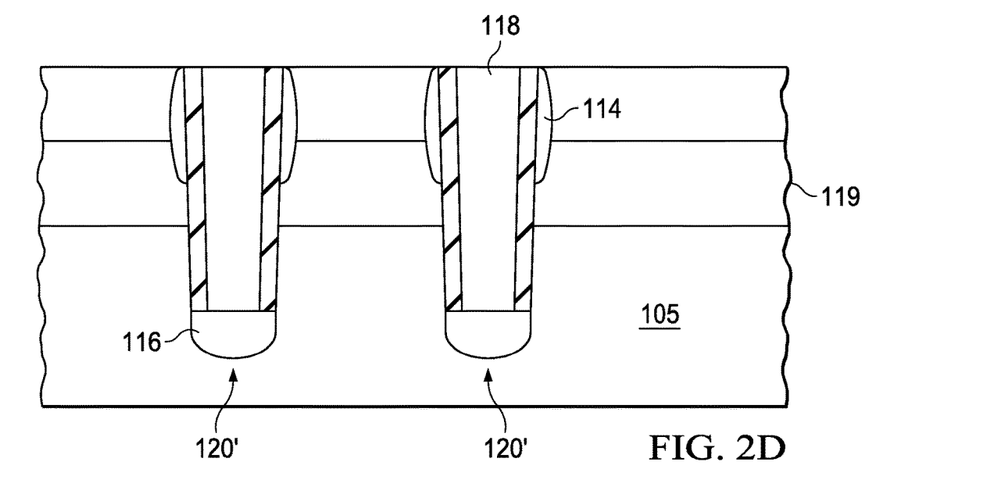

FIG. 2D shows a portion of the in-process IC showing the filled trenches 120' after removing overburden portions of deposited material 118 (e.g., CMP and removal of the trench hard mask stack). The poly CMP process generally stops on the layer 109 (e.g., silicon nitride) shown in FIG. 1E.

Figure 3:
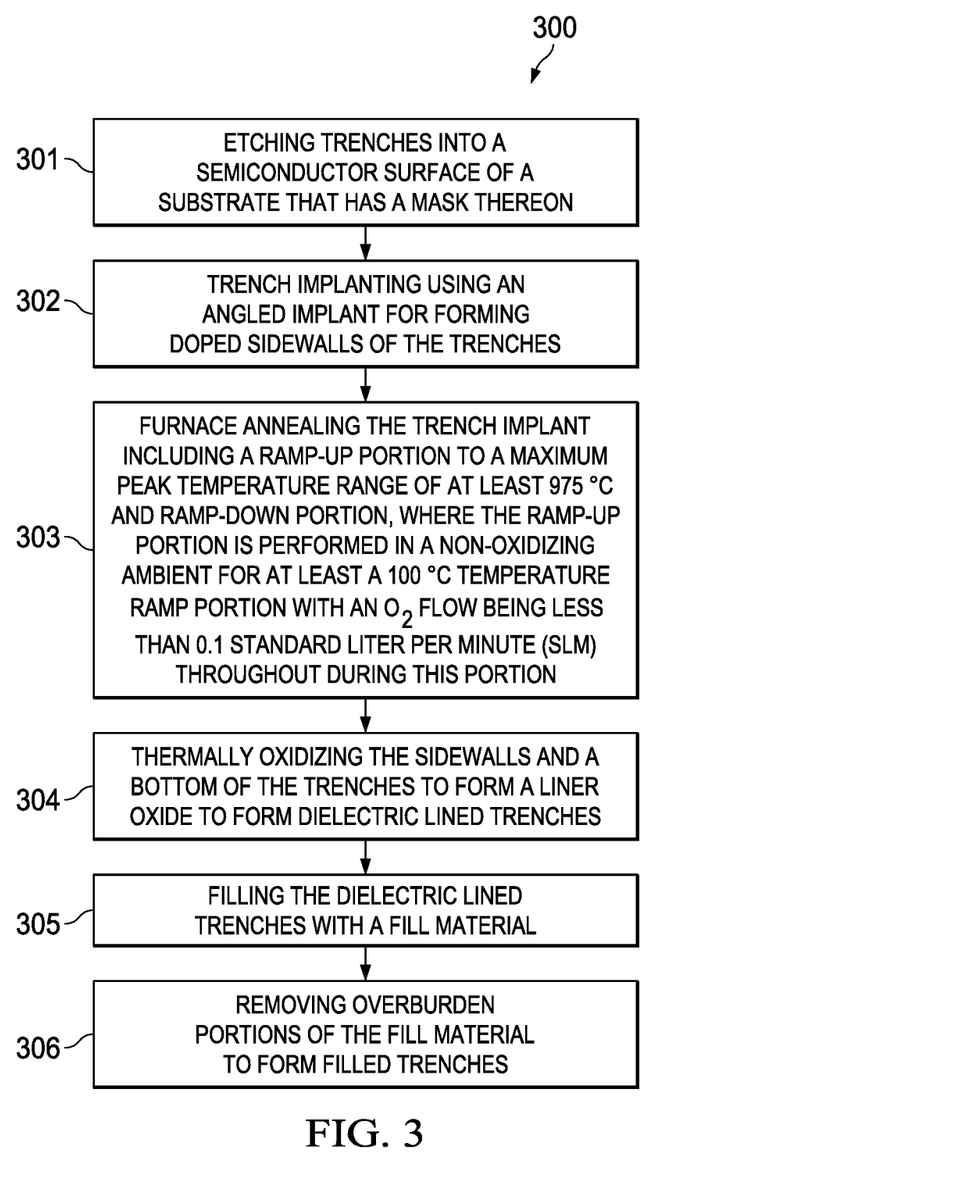
FIG. 3 is a flow chart that shows steps in an example method for forming trenches for isolation using a non-oxidizing trench anneal after sidewall implant prior to oxidation to reduce slip, according to an example embodiment.

FIG. 3 is a flow chart that shows steps in an example method 300 for forming an IC with trenches for isolation comprising a non-oxidizing trench anneal after sidewall implant prior to oxidation to reduce slip, according to an example embodiment. Step 301 comprises etching trenches into a semiconductor surface of a substrate that has a mask thereon, with the before and after etching of the trenches depicted in FIGS. 1A and 1B described above. A hard mask (e.g., hard mask stack) is generally used, but is not required. Reactive-ion etching (RIE) may be used. The trench depth is generally 0.5 µm to 30 µm.

Step 302 comprises trench implanting using an angled implant for forming doped sidewalls of the trenches. Step 302 is generally performed with a trench mask PR pattern protecting the active areas with results shown in FIG. 1C describe above. Example implant conditions comprise phosphorous or arsenic for an NBL, a dose from $1 \times 10^{15}$ cm$^{-2}$ to $1 \times 10^{16}$ cm$^{-2}$, an angle 12° to 20°, and no twist.

Step 303 comprises furnace annealing the trench implant including a ramp-up portion to a maximum peak temperature range of at least 975° C. and ramp-down portion, where the ramp-up portion is performed in a non-oxidizing ambient for at least a 100° C. temperature ramp portion with an $O_2$ flow being less than 0.1 standard liter per minute (SLM) throughout during this portion. This furnace annealing can be achieved, for example, in a furnace having a larger volume mass flow controller (MFC-01) and a smaller volume MFC (MFC-03) connected to $O_2$, by shutting off both MFCs. The ramp-up rate during the ramp-up including the ramp-up portion can be between 2° C./min and 10° C./min. See FIG. 4B described below for an example disclosed non-oxidizing ramp-up.

Step 304 comprises after the furnace annealing thermally oxidizing the sidewalls and a bottom of the trenches to form a liner oxide to form dielectric lined trenches. The thermally oxidizing can be performed in pure $O_2$, a dilute $O_2$ $N_2$/$O_2$ mix, steam using $H_2$ and $O_2$, or even HCl/$O_2$. The resulting liner oxide thickness can be from 10 nm to 280 nm. Alternatively, it may also be possible to deposit the liner oxide. The furnace anneal (step 303) can optionally be combined with the thermally oxidizing (step 304) in a single furnace operation.

Step 305 comprises filling the dielectric lined trenches with a fill material. For example, using High density plasma (HDP) oxide, or LPCVD oxide then heated to densify the deposited oxide, or polysilicon filled. Step 306 comprises removing overburden portions of the fill material and the hard mask if present to form filled trenches, such as the filled trenches 120 shown in FIG. 1F.

Figure 4A:
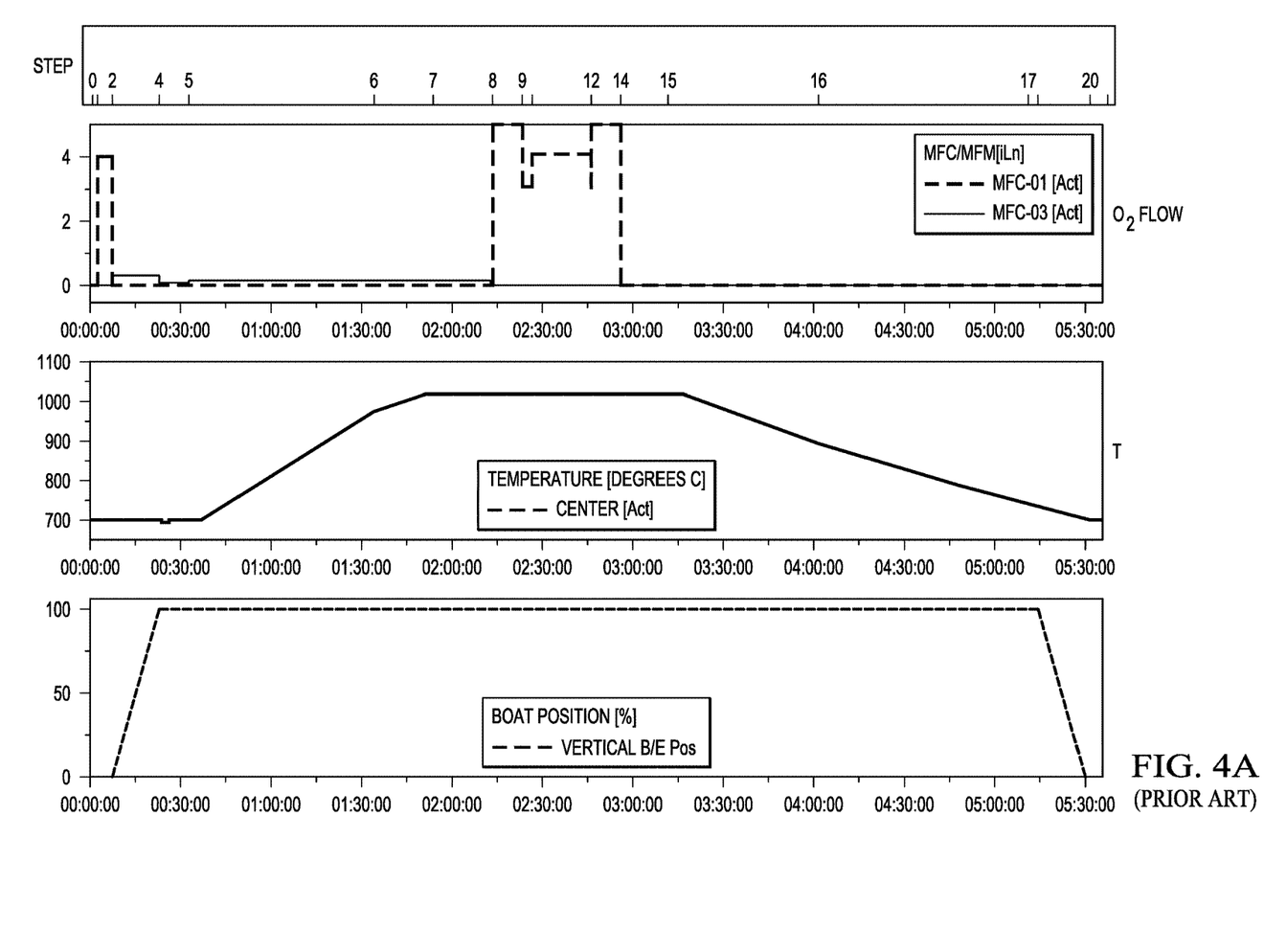
FIG. 4A shows a plot of gas flow, temperature and boat position vs. time for a known furnace damage anneal process after sidewall implant.

FIG. 4A shows a plot of gas flow, temperature and boat position vs. time for a known silicon oxide liner growth including furnace damage anneal after sidewall implant. MFC-01 is a relatively large volume $O_2$ mass flow controller (MFC) of the furnace, and MFC-03 is a relatively small volume $O_2$ MFC of the furnace that is typically used during boat load/ramp/stabilization. MFC-03 can be seen to be turned on by its controller throughout the ramp-up cycle from 700° C. all the way to 1050° C., along with MFC-01 only turned on (e.g., with a flow of several SLM) during a portion of the time at 1050° C., for forming the silicon oxide liner for the TSC trenches that is generally 10 nm to 30 nm thick.

Figure 4B:
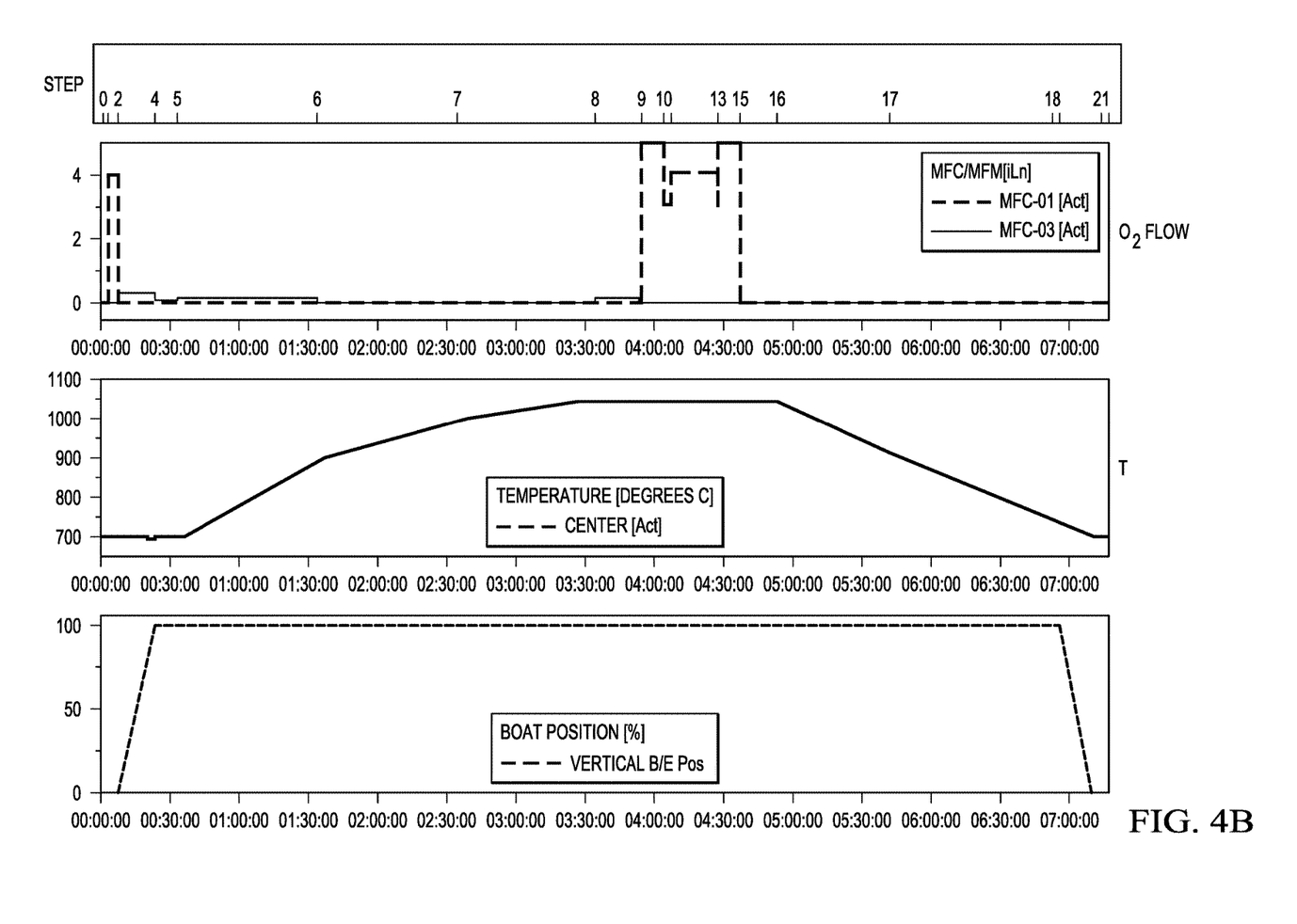
FIG. 4B shows a plot of gas flow, temperature and boat position vs. time for a disclosed non-oxidizing trench anneal process after sidewall implant prior to oxidation to reduce slip density, according to an example embodiment.

FIG. 4B shows a plot of gas flow, temperature and boat position vs. time for a disclosed non-oxidizing trench anneal after sidewall implant prior to liner oxidation to reduce slip, according to an example embodiment. FIG. 4B shows an example ramp-up cycle where the $O_2$ flow from MFC-03 is turned off early in the ramp-up, shown by example as being turned off at about 900° C., then turning the $O_2$ flow from MFC-03 back on at 1050° C. The ramp-up portion is thus shown performed in a non-oxidizing ambient for at least a 100° C. temperature ramp (shown in FIG. 4B as being a 150° C. non-oxidizing ramp) with an $O_2$ flow being less than 0.1 standard liter per minute (SLM). The MFC-03 for the ramp-up can be shifted down the ramping scale to achieve a similar result. For example the MFC-03 turn-off can be performed at 800° C. and be turned back on at 1000° C., then reaching 1050° C., along with MFC-01 on during a portion of the time at 1050° C., for forming the silicon oxide liner for the TSC trenches that is generally 10 nm to 30 nm thick.

Figure 5:
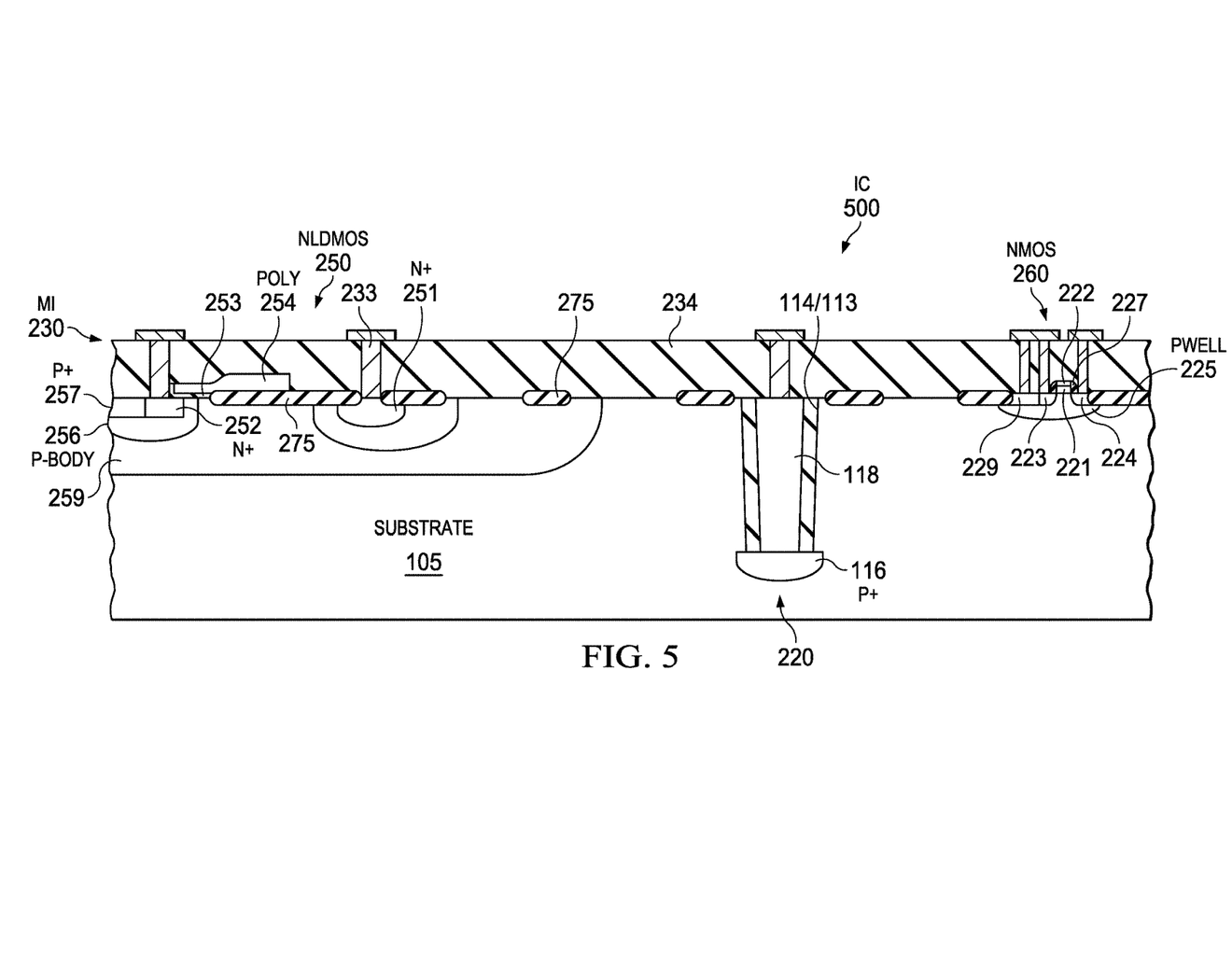
FIG. 5 is a cross sectional view of a portion of an IC having transistors in the active areas that are isolated from one another by TSC trenches, according to an example embodiment.

FIG. 5 is a cross sectional view of a portion of an IC 500 having transistors in the active areas that are isolated from one another by TSC trenches shown as TSC trench 220, according to an example embodiment. For simplicity the metal stack is shown as only a patterned metal 1 (M1) layer 230 connecting through filled (e.g., W filled) vias 233 that are through a pre-metal dielectric layer 234 to provide contact to features in or on the top surface of the substrate 105. Not all needed contacts are shown, such as contacts to the respective gates. Typically, the metal stack will include 4 or more metal layers with an interlevel dielectric (ILD) layer having vias therein between the respective metal layers.

The transistors shown comprise a laterally diffused n-channel metal-oxide-semiconductor (NLDMOS) transistor 250, and a conventional n-channel MOS (NMOS) transistor 260. The field oxide is shown as a Local Oxidation of Silicon (LOCOS) oxide 275. As used herein, an LDMOS device is synonymous with a diffused (or drain extended) metal oxide semiconductor (DMOS) device and can include both n-channel LDMOS (NLDMOS) and p-channel PLDMOS devices. In NLDMOS transistor 250, the drain 251 is laterally arranged to allow current to laterally flow, and an n− drift region is interposed between the channel and the drain to provide a high drain to source 252 breakdown voltage (BV). The source 252 is in a pbody region 256 (sometimes called a DWELL region) formed in an n-body region 259 that has a p+ contact 257. LDMOS devices are thus generally designed to achieve higher BV while minimizing specific ON-resistance in order to reduce conduction power losses. NLDMOS transistor 250 also has a gate electrode 254 such as an n+ polysilicon gate on a gate dielectric layer 253.

NMOS transistor 260 includes a gate electrode 221 on a gate dielectric 222 along with a drain 223 and source 224 formed in a pwell 225. Spacers 227 are shown on the sidewalls of the gate stack of the NMOS transistor 260. There is also a p+ contact 229 shown to the pwell 225. The IC 500 can also include PMOS devices by generally changing the doping types relative to NMOS devices.

Advantages of disclosed methods for forming trenches for isolation comprising a non-oxidizing trench anneal after sidewall implant prior to oxidation include reducing wafer slip to very low levels (<5 $cm^{-2}$, typically <1 $cm^{-2}$) which translates to improved IC multi-probe product yield (MPY). No significant cost or product integration change due to incorporation into an existing furnace recipe/step. There is no adverse device performance impact, such as no impact on MOS switching speed or breakdown voltage. Moreover, due to incorporation into an existing furnace recipe/step, no significant change in thermal budget results.

EXAMPLES

Disclosed embodiments of the invention are further illustrated by the following specific Examples, which should not be construed as limiting the scope or content of this Disclosure in any way.

Defect counting to evidence the resulting low slip density (<1 $cm^{-2}$) including along substrate edges of TSC trenches using disclosed annealing after trench sidewall implant can be obtained by a variety of methods including Scanning Infrared Depolarization (SIRD) which is generally a very effective method for detection of slip. However, due to the need for rapid measurements a COMPLUS inspection tool manufactured by Applied Materials was used to obtain defect density data presented in this Example. Reported below is a defect density that is primarily from slip dislocations, and the data is from imaging across the full area of respective die of a wafer. The wafers were p-epi on a p+ substrate. The trench depth was 26 µm, the trench implant dose $2 \times 10^{16}$ $cm^{-2}$ phosphorous, and the die size was 32 µm×30 µm. The devices formed on the wafers were later electrically tested that registered failures due to leakage in the defect identified locations.

Using the known furnace damage anneal depicted in FIG. 4A resulted in a measured defect density of 50 to 200 defects-$cm^{-2}$, and junction leakage issues for die on the finished wafer during electrical test. These defects were made visible inline by the COMPLUS inspection tool. Using a disclosed non-oxidizing trench anneal depicted in FIG. 4B after sidewall implant prior to oxidation to reduce slip resulted in a defect density of <1 defect-$cm^{-2}$, and essentially no junction leakage issues during electrical test. These very few defects present were made visible inline by use again of the COMPLUS inspection tool.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. An electronic device, comprising:
    a substrate including a semiconductor surface;
    a plurality of trenches within the substrate, each trench including:
        a sidewall having a doped region;
        a sidewall liner; and
        a filler material,
    wherein the substrate has a slip density of fewer than 5 $cm^{-2}$.

2. The device of claim 1, wherein the sidewall liner comprises silicon dioxide.

3. The device of claim 1, wherein the doped region extends along the sidewall to a depth less than a full depth of the trench.

4. The device of claim 1, wherein the filler material comprises amorphous silicon.

5. The device of claim 4, wherein the filler material provides a conductive path between a metal via and the substrate.

6. The device of claim 1, wherein the filler material contacts a doped region at a bottom of the trench.

7. The device of claim 1, wherein the trench passes through a doped buried layer in the substrate.

8. The device of claim 7, wherein the doped sidewall extends to a depth as least as deep as an upper boundary of the buried layer.

9. The device of claim 1, wherein the trench has a depth within a range between about 5 µm and about 35 µm.

10. The device of claim 1, wherein the trench is located between first and second transistors, thereby isolating the first transistor from the second transistor.

11. An integrated circuit (IC), comprising:
a substrate including a semiconductor surface;
a filled trench with sidewalls lined with a liner oxide layer having locally doped substrate edges of the trenches which extend in a depth direction along the sidewalls of the trenches from a top of the semiconductor surface to a first depth; and
a first transistor and a second transistor dielectrically isolated from one another by the filled trench,
wherein the IC has a slip density of fewer than 5 cm$^{-2}$.

12. The IC of claim 11, wherein the locally doped substrate edges of the trenches have a minimum dopant concentration of $5 \times 10^{17}$ cm$^{-3}$.

13. The IC of claim 11, wherein the substrate comprises bulk silicon or an epitaxial silicon layer on bulk silicon.

14. The IC of claim 11, wherein the filled trenches comprise top side contact (TSC) trenches which include doped polysilicon over the liner oxide layer, and have a bottom of the trenches without the liner oxide layer and with a bottom doped region so that the doped polysilicon provides an ohmic contact to the substrate.

15. The IC of claim 14, wherein the semiconductor surface includes a buried layer, and wherein a doping in the doped substrate edges has a depth that extends into the buried layer.

16. The IC of claim 11, wherein the filled trenches are 5 µm to 35 µm deep.

17. The IC of claim 11, wherein the IC has a slip density of <1 cm$^{-2}$.

18. The IC of claim 11, wherein the IC includes at least one laterally diffused metal-oxide-semiconductor (LDMOS) transistor.

* * * * *